US009764746B2

(12) United States Patent
Bhattacharjya et al.

(10) Patent No.: US 9,764,746 B2
(45) Date of Patent: Sep. 19, 2017

(54) RAILWAY TRACK GEOMETRY DEFECT MODELING FOR PREDICTING DETERIORATION, DERAILMENT RISK, AND OPTIMAL REPAIR

(71) Applicant: International Business Machines Corporation, Armonk, NY (US)

(72) Inventors: Debarun Bhattacharjya, Ossing, NY (US); Arun Hampapur, Norwalk, CT (US); Qing He, Ossining, NY (US); Hongfei Li, Briarcliff Manor, NY (US); Dhaivat P. Parikh, Plano, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 818 days.

(21) Appl. No.: 13/962,310

(22) Filed: Aug. 8, 2013

(65) Prior Publication Data

US 2014/0200830 A1 Jul. 17, 2014

Related U.S. Application Data

(63) Continuation of application No. 13/906,883, filed on May 31, 2013.
(Continued)

(51) Int. Cl.
*B61K 9/08* (2006.01)
*G06Q 10/06* (2012.01)
(Continued)

(52) U.S. Cl.
CPC .............. *B61K 9/08* (2013.01); *B61L 23/042* (2013.01); *B61L 27/0055* (2013.01);
(Continued)

(58) Field of Classification Search
CPC ..... B61K 9/08; B61L 23/042; B61L 27/0088; G06Q 10/06; G06Q 10/0635; G06F 17/5009
See application file for complete search history.

(56) References Cited

U.S. PATENT DOCUMENTS 3,381,626 A    5/1968  Fagan et al.
3,500,186 A    3/1970  Smith et al.
(Continued)

FOREIGN PATENT DOCUMENTS

EP    0982673 A2    3/2000
WO    2004076256 A1  9/2004

OTHER PUBLICATIONS

Larsson, Dan. A Study of the Track Degradation Process Related to Changes in Railway Traffic. Luleå University of Technology JvtC—Luleå Railway Research Centre Division of Operation and Maintenance Engineering 2004:48 | ISSN:1402-1757 | ISRN:LTU-LIC—04/48—SE.*

(Continued)

*Primary Examiner* — John Breene
*Assistant Examiner* — Mohammad Islam
(74) *Attorney, Agent, or Firm* — Cantor Colburn LLP; Keivan Razavi

(57) ABSTRACT

Geo-defect repair modeling is provided. A method includes logically dividing a railroad network according to spatial and temporal dimensions with respect to historical data collected. The spatial dimensions include line segments of a specified length and the temporal dimensions include inspection run data for inspections performed for each of the line segments over a period of time. The method also includes creating a track deterioration model from the historical data, identifying geo-defects occurring at each inspection run from the track deterioration model, calculating a track deterioration condition from the track deteriora- (Continued)

x = Profile
y = Alignment
h = Crosslevel
a = Gauge tion model by analyzing quantified changes in the geo-defects measured at each inspection run, and calculating a derailment risk based on track conditions determined from the inspection run data and the track deterioration condition. The method further includes determining a repair decision for each of the geo-defects based on the derailment risk and costs associated with previous comparable repairs.

18 Claims, 8 Drawing Sheets

Related U.S. Application Data

(60) Provisional application No. 61/751,704, filed on Jan. 11, 2013.

(51) Int. Cl.
  *G06F 17/50* (2006.01)
  *B61L 23/04* (2006.01)
  *B61L 27/00* (2006.01)

(52) U.S. Cl.
  CPC ...... *B61L 27/0088* (2013.01); *G06F 17/5009* (2013.01); *G06Q 10/06* (2013.01); *G06Q 10/0635* (2013.01)

(56) References Cited

U.S. PATENT DOCUMENTS

| | | | | |
|---|---|---|---|---|
| 4,173,073 A * | 11/1979 | Fukazawa | ............ | G01C 15/00 104/7.2 |
| 4,793,047 A | 12/1988 | Curtis et al. | | |
| 5,020,007 A | 5/1991 | Wu et al. | | |
| 5,542,043 A | 7/1996 | Cohen | | |
| 5,774,629 A | 6/1998 | Yamaguchi et al. | | |
| 5,791,063 A | 8/1998 | Kesler et al. | | |
| 5,867,404 A * | 2/1999 | Bryan | ............ | B61K 9/08 342/457 |
| 5,970,438 A * | 10/1999 | Clark | ............ | B61K 9/08 702/184 |
| 5,986,547 A | 11/1999 | Korver et al. | | |
| 6,324,659 B1 | 11/2001 | Pierro | | |
| 6,347,265 B1 * | 2/2002 | Bidaud | ............ | B61K 9/08 701/19 |
| 6,804,621 B1 | 10/2004 | Pedanckar | | |
| 7,164,975 B2 | 1/2007 | Bidaud | | |
| 2002/0059075 A1 * | 5/2002 | Schick | ............ | B61L 27/0094 701/31.4 |
| 2003/0055666 A1 * | 3/2003 | Roddy | ............ | B61L 27/0094 705/305 |
| 2003/0136192 A1 | 7/2003 | Tu et al. | | |
| 2004/0122569 A1 | 6/2004 | Bidaud | | |
| 2005/0021485 A1 | 1/2005 | Nodelman | | |
| 2006/0001547 A1 | 1/2006 | Davenport | | |
| 2006/0015224 A1 | 1/2006 | Hileary | | |
| 2007/0087756 A1 | 4/2007 | Hoftberg | | |
| 2007/0152107 A1 | 7/2007 | LeFebvre | | |
| 2007/0217670 A1 | 9/2007 | Bar-Am | | |
| 2009/0043547 A1 | 2/2009 | Kirby et al. | | |
| 2009/0063115 A1 | 3/2009 | Lu et al. | | |
| 2009/0070064 A1 | 3/2009 | Farritor et al. | | |
| 2009/0113049 A1 | 4/2009 | Nasle et al. | | |
| 2009/0326746 A1 | 12/2009 | Mian | | |
| 2010/0004804 A1 * | 1/2010 | Anderson | ............ | B61K 9/08 701/19 |
| 2010/0026551 A1 * | 2/2010 | Szwilski | ............ | B61K 9/08 342/22 |
| 2010/0241639 A1 | 9/2010 | Kifer et al. | | |
| 2011/0238336 A1 * | 9/2011 | Di Scalea | ............ | G01N 29/043 702/56 |
| 2012/0059684 A1 * | 3/2012 | Hampapur | ......... | G06Q 10/0635 705/7.28 |
| 2012/0143796 A1 | 6/2012 | Lozano | | |
| 2012/0300060 A1 * | 11/2012 | Farritor | ............ | B61K 9/08 348/125 |
| 2013/0231873 A1 | 9/2013 | Fraser | | |

OTHER PUBLICATIONS

Ferreira. L. and Murray, M. (1997). Modelling rail track deterioration and maintenance: current practices and future needs. Transport Reviews, 17 (3), 207-221. Copyright 1997 Taylor & Francis.*
Zhao, Chan, Roberts, and Stirling. Assessing the economic life of rail using a stochastic analysis of failures. Railway Research Centre, The University of Birmingham, Birmingham, UK. Jan. 11, 2006. DOI: 10.1243/09544097JRRT30.*
Nielsen et al.,Life cycle management of railway bridges—defect management, 2012, pp. 424-435.*
Berawi et al.,Evaluating Track Geometrical Quality Through Different Methodologies, 2010, IJTech 201, pp. 38-47.*
Beichelt et al.,General Failure Model Applied to Preventive Maintenance Policies, 1980, IEEE, pp. 39-41.*
Oyama et al. Mathematical Modeling Analyses for Obtaining an Optimal Railway Track Maintenance Schedule, 2006, pp. 207-224.*
U.S. Appl. No. 13/873,829; Non-Final Office Action, filed: Apr. 30, 2013; Date Mailed: Jan. 28, 2015; 15 pages.
U.S. Appl. No. 13/873,851, Notice of Allowance; filed: Apr. 30, 2013; Date Mailed: Mar. 16, 2015; 12 pages.
U.S. Appl. No. 13/873,851; Final Office Action; filed: Apr. 30, 2013; Date Mailed: Jan. 2, 2015; 13 pages.
U.S. Appl. No. 13/873,851; Non-Final Office Action; filed: Apr. 30, 2013; Date Mailed: Jun. 10, 2014; pp. 1-7.
U.S. Appl. No. 13/962,203; Non-Final Office Action; filed: Aug. 8, 2013; Date Mailed: Jun. 3, 2015; 28 pages.
Broomhead et al., "Multivariable Functional Interpolation and Adaptive Networks", Complex Systems Publication, Inc. 1988; 35 pages.
Hutchinson et al., "A Nonparametric Approach to Pricing and Hedging Derivative Securities Via Learning Networks," The Journal of Finance, vol. XLIX, No. 3, Jul. 1994; 40 pages.
International Search Report and Written Opinion; International Application No. PCT/US2014/010628; International Filing date: Jan. 8, 2014; Date of Mailing: Aug. 13, 2014; 13 pages.
A. Bhattacharya, D. B, Dybsibm, "Sparse Bayesian Infinite factor models" 2011 Biometrica Trust, pp. 291-306.
P. Newbold, C. W. J. Granger, "Experience with Forecasting Univariate Time Series and the Combination of Forecasts" J. R. Statistical Society, (1974), pp. 131-165.
U.S. Appl. No. 13/873,829; Non-Final Office Action, filed, Apr. 30, 2015; Date Mailed: Dec. 11, 2015; 54 pages.
U.S. Appl. No. 13/873,859; NonFinal Office Action, filed, Apr. 3, 2013; Date Mailed: Oct. 20, 2015; 20 pages.
U.S. Appl. No. 13/907,056, Non-Final Office Action, filed, May 31, 2013; Date Mailed: Nov. 20, 2015; 26 pages.
U.S. Appl. No. 13/962,203; Final Office Action; filed, Aug. 8, 2013; Date Mailed: Nov. 4, 2015; 51 pages.
U.S. Appl. No. 13/962,229; Non-Final Office Action, filed, Aug. 8, 2013; Date Mailed: Jan. 5, 2016; 23 pages.
U.S. Appl. No. 13/962,252; Non-Final Office Action; filed, Aug. 8, 2013; Date Mailed: Jan. 25, 2016; 47 pages.
U.S. Appl. No. 13/962,287; Non-Final Office Action; filed, Aug. 8, 2013; Date Mailed: Dec. 15, 2015; 28 pages.
U.S. Appl. No. 13/907,056; Final Office Action; filed May 31, 2013; Date Mailed May 4, 2016; 25 pages.
U.S. Appl. No. 13/962,287; Final Office Action; filed: Aug. 8, 2013; Date Mailed: May 5, 2016; 26 pages.

* cited by examiner

| Defect type | Intercept | Traffic (MGT) | Traffic (# of cars) | Traffic (# of trains) | Sequence # | Traffic speed |
|---|---|---|---|---|---|---|
| ALIGN | -7.71E+00 | -- | -- | -- | -- | -- |
| CANT | -7.66E+00 | -7.01E-02 | 6.05E-06 | 6.52E-04 | 6.71E-02 | -- |
| DIP | -7.58E+00 | 7.21E-02 | -- | -- | -- | -- |
| GAUGE_C | -8.53E+00 | 8.62E-02 | -- | -- | 1.13E-01 | -- |
| GAUGE_W1 | -7.42E+00 | 3.58E-02 | 4.64E-06 | -- | 7.02E-02 | -5.08E-01 |
| GAUGE_W2 | -8.08E+00 | 1.90E-02 | -- | 2.05E-04 | 7.98E-02 | -- |
| HARM_X | -7.44E+00 | -- | -- | -- | -- | -- |
| OVERELEV | -7.58E+00 | 2.45E-01 | -- | -- | 6.99E-02 | -- |
| REV_X | -7.40E+00 | -- | -- | -- | -- | -- |
| SUPER_X | -8.97E+00 | -- | -- | -- | -- | -- |
| SURF | -6.99E+00 | 2.00E-01 | -- | -1.33E-03 | 4.36E-02 | -- |
| WEAR | -8.22E+00 | 2.95E-02 | -- | 4.73E-04 | 7.49E-02 | -- |
| XLEVEL | -7.66E+00 | -- | 2.64E-06 | 3.23E-04 | 9.18E-02 | -- |

FIG. 5

| covariates | coef | exp (coef) (hazard ratio) | se(coef) | z | Pr(>|z|) |
|---|---|---|---|---|---|
| numCII_GAUGE_W1 | 1.01E-01 | 1.11E+00 | 1.96E-02 | 5.165 | 2.40E-07 |
| amp90_SUPER_X | 5.10E-01 | 1.67E+00 | 1.68E-01 | 3.028 | 0.00246 |
| amp90_GAUGE_C | 6.33E-01 | 1.88E+00 | 2.10E-01 | 3.013 | 0.00259 |
| numCII_REV_X | 6.66E-01 | 1.95E+00 | 3.21E-01 | 2.077 | 0.03782 |
| amp90_DIP | 9.58E-01 | 2.61E+00 | 4.67E-01 | 2.052 | 0.04016 |
| amp90_WARP | 7.44E-01 | 2.10E+00 | 3.69E-01 | 2.014 | 0.04404 |
| amp90_HARM_X | 5.43E+00 | 2.29E+02 | 2.78E+00 | 1.958 | 0.05028 |
| numcII_GAUGE_W2 | 2.28E-01 | 1.26E+00 | 1.17E-01 | 1.948 | 0.05139 |
| amp90_WEAR | 1.54E+00 | 4.65E+00 | 8.34E-01 | 1.843 | 0.06533 |
| amp90_ALIGN | 4.17E+00 | 6.45E+01 | 2.40E+00 | 1.736 | 0.08261 |

| Type | Notation | Description |
|---|---|---|
| Indices | $i \in I$ | Index for section in a line segment |
| | $j \in J$ | Index for defect category in the set of categories observed in section $i$ |
| | $k \in K$ | Index for individual Class II defect of type $j$ in section $i$ |
| | $a \in A$ | Index for chosen alternative out of all possible alternatives available to the decision maker |
| Decision variables | $x_a^i \; \forall i \in I, a \in A$ | Indicator which is 1 if alternative $a$ is chosen for section $i$, otherwise 0 |
| Parameters | $B$ | Budget for repair |
| | $C_D$ | Average derailment cost, assumed identical for all sections |
| | $C_I^i$ | Cost of repairing all existing Class I defects in section $i$ |
| | $C_{1a}^i \; \forall i \in I, a \in A$ | Cost of repairing all converted Class I defects from existing Class II defects if alternative $a$ is chosen for section $i$ |
| | $C_{2a}^i \; \forall i \in I, a \in A$ | Cost of repairing all Class II defects if alternative $a$ is chosen for section $i$ |
| | $P_a^i \; \forall i \in I, a \in A$ | Probability of a derailment in the time from this inspection run to the next, if alternative $a$ is chosen for section $i$ |
| | $P_a^i \; \forall k \in K, a \in A$ | Probability that Class II defect $k$ will progress to a Class I defect if alternative $a$ is chosen |
| | $C_{ja}^i \; \forall j \in J, a \in A$ | Cost of repairing a Class I defect of category $j$ when alternative $a$ is chosen |

FIG. 9

RAILWAY TRACK GEOMETRY DEFECT MODELING FOR PREDICTING DETERIORATION, DERAILMENT RISK, AND OPTIMAL REPAIR

CROSS REFERENCE TO RELATED APPLICATION

The present application is a Continuation Application of U.S. patent application Ser. No. 13/906,883, filed on May 31, 2013, which claims the benefit of U.S. Patent Application Ser. No. 61/751,704 filed on Jan. 11, 2013, which are hereby incorporated by reference herein in their entirety.

BACKGROUND

In the United States, railroads represent a significant mode of transportation for moving freight. Thus, proper maintenance of the railway lines through repair and renewal is important for railroad operation and safety.

Track maintenance activities can be categorized into two groups: preventive maintenance and corrective maintenance. Preventive maintenance is pre planned and carried out to avoid future defects, whereas corrective maintenance repairs existing defects in the infrastructure. Track repair is usually performed by a local track master in the network, and it is typically conducted on demand. Although corrective maintenance occurs on a relatively small scale as compared to preventive maintenance, it is important to repair severe track defects because they may lead to catastrophic train derailments.

SUMMARY

According to one embodiment of the present invention, a method for predictive modeling is provided. The method includes logically dividing a railroad according to spatial and temporal dimensions with respect to historical data collected for the railroad network. The spatial dimensions including line segments of a specified length and the temporal dimensions including inspection run data for inspections performed for each of the line segments over a specified period of time. The method also includes creating, via a computer processor, a track deterioration model from the historical data, current track conditions, and traffic data; identifying geo defects occurring at each inspection run from the track deterioration model; and calculating, via the computer processor, a track deterioration condition from the track deterioration model by analyzing quantified changes in the geo defects measured at each inspection run. The method further includes calculating a derailment risk based on track conditions determined from the inspection run data and from the track deterioration conditions, and determining a repair decision for each of the geo defects based on the derailment risk and historically determined costs associated with previous comparable repairs.

According to another embodiment of the present invention, a system for predictive modeling is provided. The system includes a computer processing system communicatively coupled to a storage device storing historical data collected for a railroad network, and an application executable by the computer processing system. The application is configured to implement a method. The method includes logically dividing the railroad network according to spatial and temporal dimensions with respect to the historical data collected for the railroad network. The spatial dimensions include line segments of a specified length and the temporal dimensions include inspection run data for inspections performed for each of the line segments over a specified period of time. The method also includes creating a track deterioration model from the historical data, current track conditions, and traffic data; identifying geo defects occurring at each inspection run from the track deterioration model; and calculating a track deterioration condition from the track deterioration model by analyzing quantified changes in the geo defects measured at each inspection run. The method further includes calculating a derailment risk based on track conditions determined from the inspection run data and from the track deterioration conditions, and determining a repair decision for each of the geo defects based on the derailment risk and historically determined costs associated with previous comparable repairs.

According to a further embodiment of the present invention, a computer program product for providing predictive modeling is provided. The computer program product includes a storage medium embodied with machine readable program instructions, which when executed by a computer causes the computer to implement a method. The method includes logically dividing a railroad according to spatial and temporal dimensions with respect to historical data collected for the railroad network. The spatial dimensions including line segments of a specified length and the temporal dimensions including inspection run data for inspections performed for each of the line segments over a specified period of time. The method also includes creating, via a computer processor, a track deterioration model from the historical data, current track conditions, and traffic data; identifying geo defects occurring at each inspection run from the track deterioration model; and calculating, via the computer processor, a track deterioration condition from the track deterioration model by analyzing quantified changes in the geo defects measured at each inspection run. The method further includes calculating a derailment risk based on track conditions determined from the inspection run data and from the track deterioration conditions, and determining a repair decision for each of the geo defects based on the derailment risk and historically determined costs associated with previous comparable repairs.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 5 depicts a table including sample data representing estimation results of a track deterioration model in accordance with an embodiment of the present invention;

FIG. 9 is a table of model parameters used in optimization formulations in accordance with an embodiment of the present invention.

DETAILED DESCRIPTION

Figure 1:
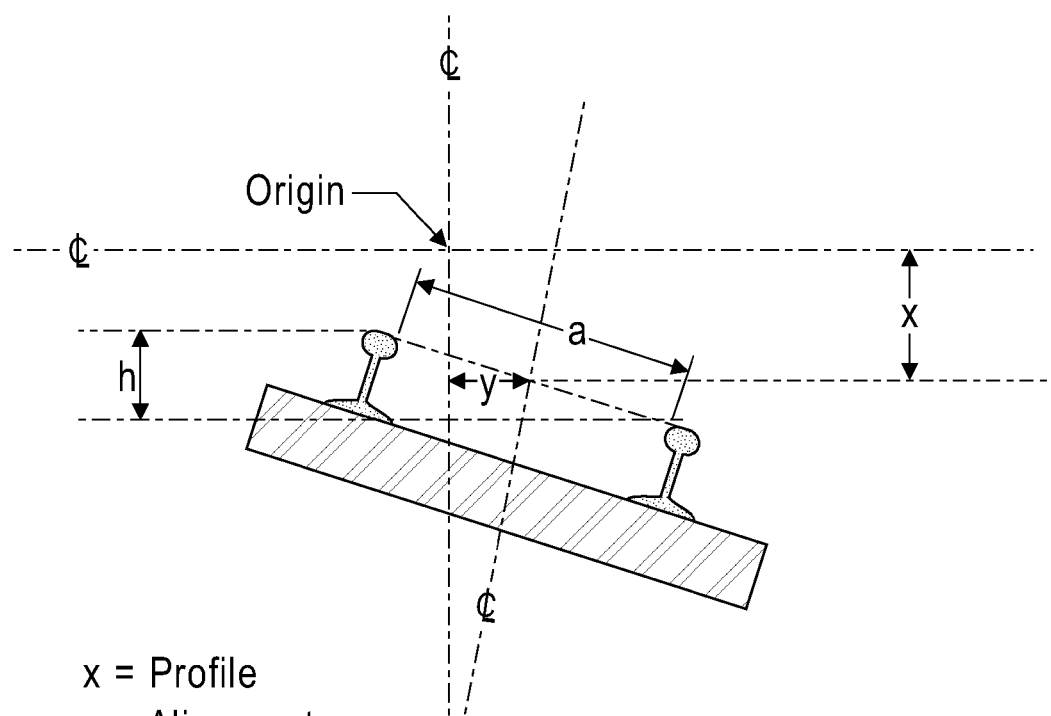
FIG. 1 is a graphical depiction of track geometry parameters in accordance with an embodiment of the present invention.

Track defects have become a leading cause of train accidents in the United States. These defects may be categorized into one of two groups: track structural defects and track geometry defects. Track structural defects are generated from the structural conditions of the track, which include the condition of the rail, sleeper, fastening systems, subgrade and drainage systems. On the other hand, track geometry defects (also referred to herein as geo defects) indicate severe ill conditioned geometry parameters such as profile, alignment, gauge, cant and twist, as shown in FIG. 1.

In determining track deterioration, track segments may be divided into several shorter sections for analyzing summary statistics of raw geometry measurements. The overall statistics provide a measure of segment quality, called Track Quality Indices (TQIs). TQIs may be used for preventive maintenance scheduling, since they provide a high level assessment of railway track performance; however, they are not able to identify individual severe geo defects for track repair. According to the US Federal Railroad Administration (FRA) track safety standards, individual defects whose amplitudes exceed a certain tolerance level must be treated. Traditionally, geometry cars generally classify each defect by its severity as either Class I or Class II. Class I defects are those in violation of the FRA track safety standards, and railroads must fix these defects within a certain time period after their discovery or else they risk being fined. Class II defects are those whose amplitudes are currently below FRA limits, and they may or may not meet the particular railroad's own standards for repair. According to current practice, railroads fix Class I geo defects almost immediately after inspection and they examine the Class II defects, repairing them based on their field experience. Hence, in order to make track repair decisions, it is desirable for existing railroads to address the following three questions: (1) how Class II geo defects deteriorate into Class I defects; (2) how Class II geo defects affect derailment risk; and (3) how to repair geo defects within a budget. The following geo defects are described below:

ALIGN. Align is the average of the left and right of a chord alignment.

CANT. Rail cant (angle) measures the amount of vertical deviation between two flat rails from their designated value (e.g., one degree is approximately equal to ⅛" for all rail weights).

DIP. Dip is the largest change in elevation of the centerline of the track within a certain distance moving window. The dip may represent either a depression or a hump in the track and approximates the profile of the centerline of the track.

GAUGE_C. Gauge change is the difference in two gauge readings up to a specified distance.

GAUGE_TGHT. GAUGE_TGHT measures how much tighter the gauge is from a standard (e.g., a standard gauge of 56½").

GAUGE_W1. GAUGE_W1 is the distance between right and left rail measured ⅝" below the railhead.

GAUGE_WIDE. GAUGE_WIDE reflects how much wider the gauge is from a standard (e.g., a standard 56½"). The amplitude of the GAUGE_WIDE plus 56½" is equal to the actual track gauge reading.

GAUGE_W2. GAUGE_W2 is similar to GAUGE_W1 except it applies to concrete.

HARM_X. Harmonic cross level defect refers to two cross level deviations that are a certain distance apart in a curve.

OVERELEV. Over elevation occurs when there is an excessive amount of elevation in a curve (overbalance) based on the degree of curvature and the board track speed.

REV_X. Reverse cross level occurs when the right rail is low in a left hand curve or the left rail is low in a right hand curve.

SUPER_X. Super cross level, elevation or super elevation measured at a single point in a curve.

SURF. Uniformity of rail surface measured in short distances along the tread of the rails. Rail surface is measured over a 62 foot chord, the same chord length as the FRA specification.

TWIST. Twist is the difference between two cross level measurements a certain distance apart.

WARP. Warp is the difference between two cross level or elevation measurements up to a certain distance apart.

WEAR. The Automated Rail Weight Identification System (ARWIS) identifies the rail weight while the car is testing and measures the amount of head loss. The system measures for vertical head wear (VHW) and gauge face wear (GFW) per rail.

XLEVEL. Cross level is the difference in elevation between the top surfaces of the rails at a single point in a tangent track segment.

The exemplary geo defect repair modeling processes provide a framework for making optimal track geo defect repair decisions, in order to appropriately reduce the probability of a derailment as well as its associated costs. Additionally, prioritized track geometry maintenance reduces dynamic vehicle and track interaction, thus reducing the stress state of the railroad. The exemplary geo defect repair modeling processes and analytical framework for geo defect repair minimizes total expected costs, which include potential derailment costs and repair costs. The geo defect repair modeling processes formulate and integrate three models: a track deterioration model, a survival model, and an optimization model. The track deterioration model is used to study the degradation of Class II geo defects' amplitudes, the survival model is used to assess the derailment risk as a function of the track condition, and the optimization model is used to optimize track repair decisions.

Figure 2:
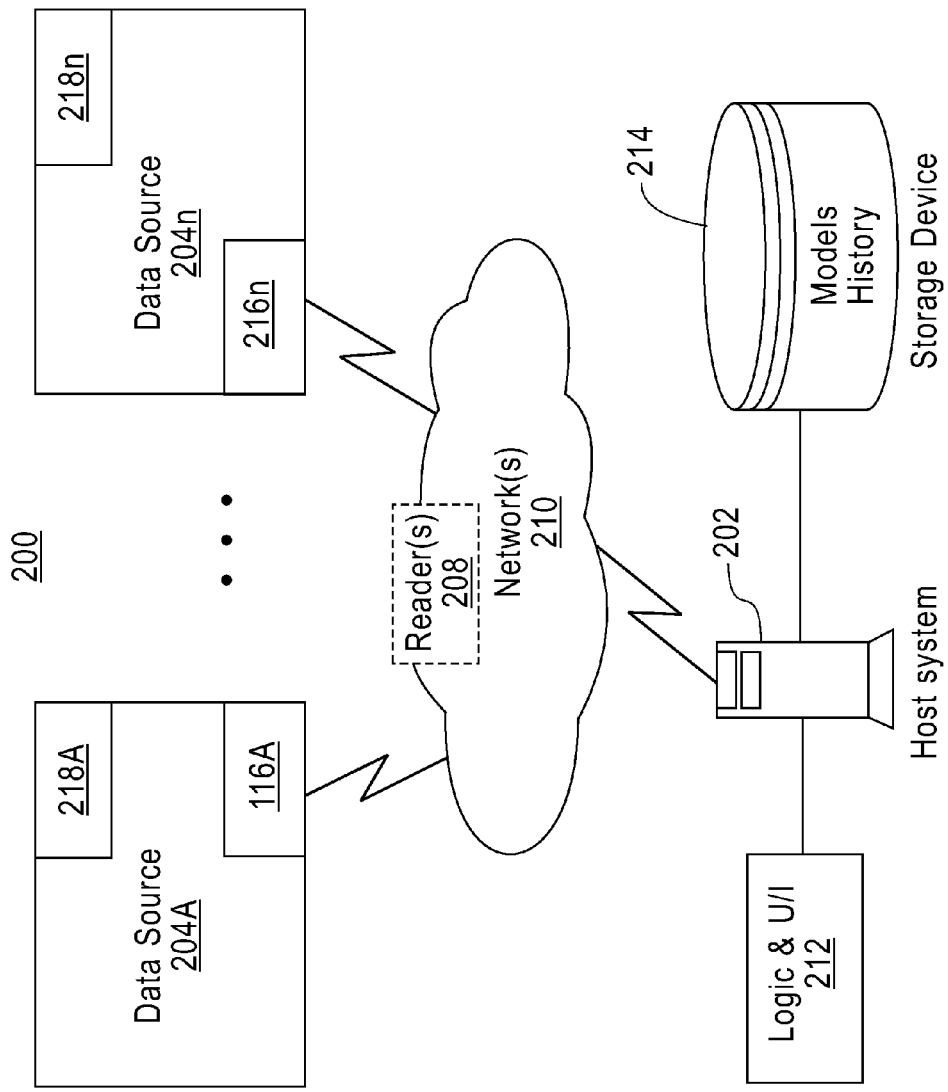
FIG. 2 depicts a block diagram of a system upon which geo defect repair modeling processes for asset management and repair may be implemented according to an embodiment of the present invention.

Turning now to FIG. 2, a system 200 upon which the geo defect repair modeling processes may be implemented will now be described in an exemplary embodiment. The system 200 of FIG. 2 includes a host system 202 in communication with data sources 204A 204n (referred to collectively as data sources 204) over one or more networks 210.

The host system 202 may be implemented as a high speed computer processing device (e.g., a mainframe computer) that is capable of handling a large volume of data received from the data sources 204. The host system 202 may be implemented by any entity that collects and processes a large amount of data from a multitude of data sources 204 to manage, or may be offered as a service to such entity by, e.g., an application service provider (ASP).

The data sources 204 may include devices configured to capture raw data from aspects of the asset, as well as any conditions surrounding the asset. In the railroad industry, for example, assets may be railroad tracks, as well as cars that travel along the tracks (and their constituent parts). The data sources 204 may include detectors, such as probes, sensors, and other instrumentation that are configured to measure qualitative aspects of the assets or surrounding conditions, such as temperature, weight or load, strain, dimensions (e.g., indications of wear), sound, and images, to name a few. In the railroad industry, the measurements may be taken with regard to railroad track components and vehicle wheels. In this embodiment, detectors that may be used as sources of data include machine vision detectors (MVDs), wheel impact load detectors (WILDS), optical geometry detectors (OCDs), truck performance detectors (TPDs), acoustic bay detectors (ABDs), hot box detectors, warm bearing detectors, and hot wheel/cold wheel detectors. In addition to the qualitative aspects, the data sources 104 may capture time, physical location, object location, and other information regarding the subject of measurement, as will be described herein. In this regard, the data sources 104 reflect multi dimensional detection devices, as they are configured to collect a wide variety of different types of information.

The data sources 204A 204n may include (or may be coupled to) corresponding communication components 216A 216n (referred to collectively as communication components 216) for transmitting captured data over one or more networks. In an embodiment, the communication components 216 may include, e.g., transceivers, antennae, and/or network cards for receiving and conveying data using wireless and/or wireline transmission technologies including radio frequency (RF), WiFi, Bluetooth, cellular, satellite, copper wiring, co axial cabling, etc. For example, a probe on one of the data sources 204 collects data from a location (e.g., a location on a railroad track) and transfers the data to the corresponding communication component 216 for transmission over networks 210 to the host system 202. In an embodiment, as shown in FIG. 2, the networks 210 may include one or more reader devices 208 for receiving the data from the data sources 204. In the railroad industry, e.g., the reader devices 208 may be RF readers positioned at defined locations (e.g., at fixed length intervals) along the railroad track. The RF readers 208 read data from corresponding data sources 204 (via the communication components 216, which may be RF antennae) as the data sources 204 (embedded in the vehicles) pass within communicative range of the reader devices 208.

In an embodiment, the data captured by the data sources 204 may be transmitted as raw data to the host system 202 or may be processed prior to transmission. The data sources 204A 204n may also include corresponding computer processors 218A 218n (collectively referred to as computer processors 218) for processing the raw data and/or formatting the data for transmission over the networks 210. Alternatively, if the data sources 204 do not include a computer processor, the captured data may be transmitted via the communication components 216 to a computer processor configured for receiving the data.

In another embodiment, some of the data sources 204 may alternatively include other information sources, such as cameras or portable communication devices (e.g., cellular telephones, smart phones, or other portable devices) operated by users who are in direct observation of the asset or surrounding conditions who have observed an event that may have an impact on safety. The data collected by the host system 202 from these portable devices may include texts, images, messages, or other information provided by a user of a communication device. For example, an observer near a railroad track may witness a previously unreported defect or anomaly, record an image of the defect, and transmit the image with date/time information, and alternatively a text description, to the host system 202 or another entity which forwards the information to the host system 202.

The networks 210 may include any type of networks, such as local area networks, wide area networks, virtual private networks, and the Internet. In addition, the networks 210 may be configured to support wireless communications, e.g., via radio frequency (RF) communications, cellular networks, satellite networks, and global positioning (GPS) systems.

The host system 202 executes logic 212 for implementing the exemplary geo defect repair modeling processes, as well as other processes, as described herein. The logic 212 includes a user interface component for enabling authorized users to set preferences used in configuring data sources 204 employed in the processes described herein, as well as generating and executing models, performing analysis on the histories of previously implemented models, and facilitating the generation of new models, or evolvement of existing models, to increase the ability for the managing entity to ensure reliable operation. The preferences may include designating a frequency of data collection by the data sources 204. The logic 212 may also be configured to utilize the information acquired from execution of the models to analyze and adopt repair plans for components of the asset. These, and other features of the predictive modeling, will be described further herein.

The host system 202 is communicatively coupled to a storage device 214 that stores various data used in implementing the geo defect repair modeling processes. For example, the storage device 214 may store models, historical operational and measurement data, repair histories, etc., and other information desired. The storage device 214 may be directly in communication with the host system 202 (e.g., via cabling) or may be logically addressable by the host system 202, e.g., as a consolidated data source over one or more networks 210.

Models are generated from history data collected from the data sources 204. Patterns of data from the measurements and resulting repair work can be used in a predictive manner for estimating when repair work should be performed and which conditions indicate priority scheduling of repair work. In addition, as new data is received, the models can be updated to reflect any changes discovered. A user interface of the logic 212 may be used to present organized history data, as well as other information. The created model may be stored as one of several stored models, e.g., in the storage device 214 of FIG. 2. As new data is received from the data sources 204, it can be applied to the models and may be used to update the models in order to ascertain future repair needs or critical issues that require immediate attention.

Data Summary and Pre Processing

Figure 3:
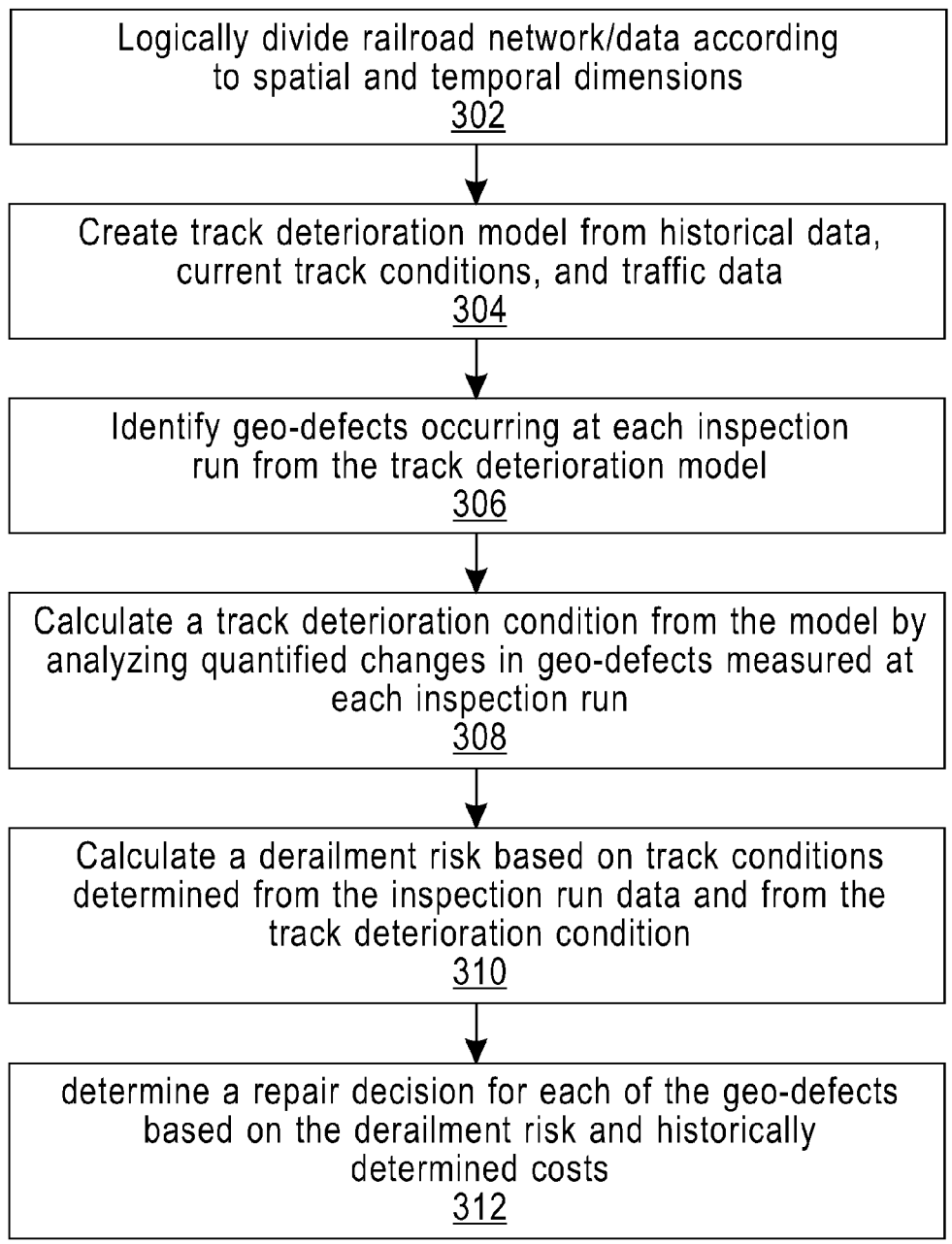
FIG. 3 depicts a flow diagram describing a process for implementing geo defect repair modeling processes for asset management and repair according to an embodiment of the present invention.

A flow diagram describing a process for implementing the geo defect repair modeling processes will now be described in an embodiment. The process of FIG. 3 assumes that a user of the geo defect repair modeling processes accesses the application 212 of the host system 202 and requests data from the storage device 214, whereby the storage device 214 stores data from a railroad network as described in FIG. 2. The geo defect repair modeling processes utilizes field datasets from the existing railroad network, e.g., including traffic data, derailment data, and geo defect data over a defined period of time (e.g., 3 years). Since main line tracks typically carry most of the traffic, and derailments associated with these tracks usually cost much more than other track types, the analysis may focus on several hundreds or thousands of miles of main line tracks. The datasets may include the historical data received from the data sources 204 and stored in the storage device 214 of FIG. 2.

At step 302, the railroad network and associated datasets are logically divided and processed along both spatial and temporal dimensions. In particular, spatially, the rail network is defined by line segments (e.g., segments connecting two cities), track numbers (0 8 for main line tracks), and mile post locations. Constructed in such a fashion, the rail lines may range from a few miles to hundreds of miles. To generate consistent spatial units and accommodate different modeling purposes, the main line network may be further divided into two different levels of smaller segments, called lots and sections. At the finer level of granularity, each lot may be 0.02 mile (about 100 ft) in length, used for track deterioration analysis. At a higher level, a continuous track segment may be divided into two mile long sections, used for track derailment risk as well as geo defect repair modeling.

In terms of processing the datasets along temporal dimensions, regular track geometry inspection may be performed several times per year (e.g., 3 to 6 times per year) according to the characteristics of each track segment. Geo defects may be identified, reported, and updated after each inspection run. When they occur in the same inspection run window, different types of geo defects are aggregated to the level of an inspection run.

The Track Deterioration Model

At step 304, the geo defect repair modeling processes, via the application 112, develop a track deterioration model to represent the causes and consequences of track deterioration. At step 306, geo defects are identified from the datasets according to the spatial and temporal dimensions. The model takes various factors into account, including the current track conditions and traffic information, and it has the capability to predict future track conditions. Track deterioration may be captured by studying geo defect amplitude changes, measured at each geometry inspection.

The model constructs the relationships between the effective parameters and the track deterioration rate, while incorporating the uncertainty caused by the unknown factors and measurement noise. By developing the model, the geo defect repair modeling processes are able to predict the deterioration of each geo defect and the risk of a Class II geo defect becoming Class I in the future.

To model track deterioration, the geo defect repair modeling processes track the evolution of track defects. However, due to the lack of geo defect indices, it may not be possible to track any particular geo defect over time. This situation may be resolved by tracking the condition of small track segments, where each segment contains very few geo defects for each inspection run. In particular, the tracks are divided into non overlapping lots of equal length of 0.02 miles, (i.e., 105.6 feet). Historically, ninety percent of geo defect lengths are shorter than 100 feet and about fifty percent of geo defect lengths are about 30 40 feet. The defects are then aggregated by inspection run for each defect type. The 90 percentile of the amplitude is used to represent the track segment condition for the inspection run under consideration.

The data analysis includes fitting different models for different defect types, since the model parameters having varying effects on deterioration rate for each defect type. This analysis assumes that geo defects typically worsen over time (e.g., defect amplitudes increase when there is no maintenance work). For each defect type, let $y_k(t)$ denote the aggregated geo defect amplitude (e.g., the 90 percentile of the defect amplitudes) of the track segment k at inspection time t. The deterioration rate or the amplitude change rate over time $\Delta t$ can be represented as $(y_k(t+\Delta t)-y_k(t))/\Delta t$.

The deterioration rate may be expressed as:

$$\log\left(\frac{y_k(t+\Delta t)-y_k(t)}{\Delta t y_k(t)}\right) = \alpha_0 + \alpha_1 X_{1k}(t) + \ldots + \alpha_p X_{pk}(t) + \varepsilon_k(t)$$

Based on the data analysis, an exponential relationship between the external factors $X_{1k}(t), \ldots, X_{pk}(t)$ and the deterioration rate may be used in the model. It is assumed that the deterioration rate is linearly related with the current track condition. The random error, $\varepsilon_k(t)$, is assumed normally distributed with mean equal to 0 and standard deviation $\sigma^2$.

Figure 4A:
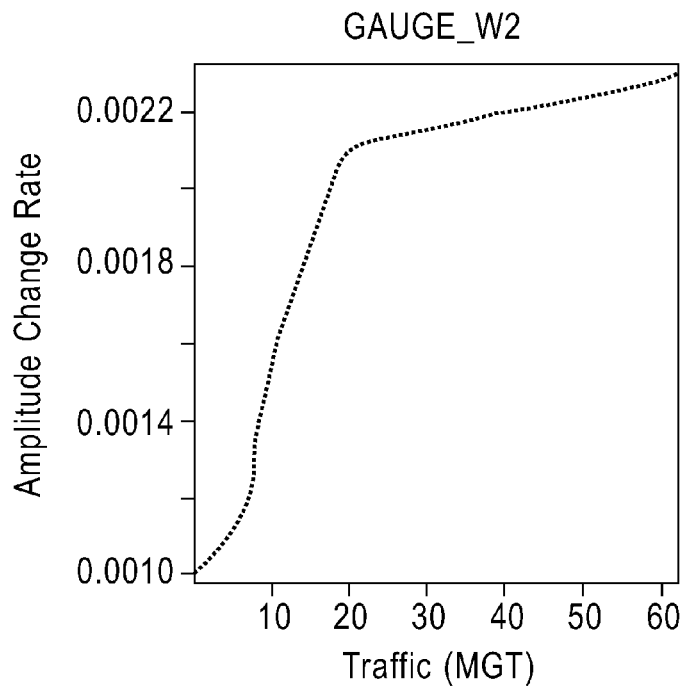
FIGS. 4A 4B are graphical depictions of geo defect amplitude change rates for two defect types from results of implementing geo defect repair modeling processes in accordance with an embodiment of the present invention.
Figure 4B:
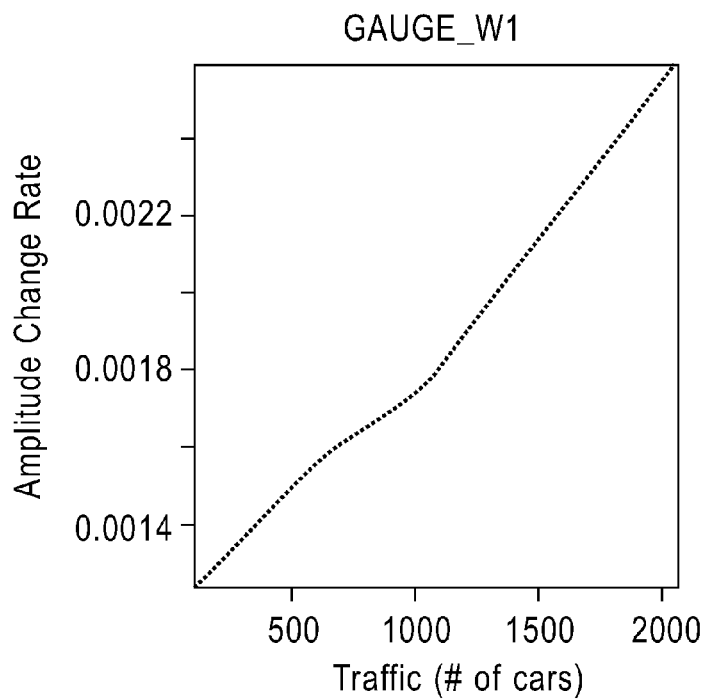

The factors considered in the model include monthly traffic MGT, monthly total number of trains, number of geo defects of one particular type in one inspection run, and the duration of the Class II geo defect before it becomes Class I. Model fitting reflects that factors have different impacts on deterioration rates for each defect type. The coefficients, $\alpha_l, \ldots, \alpha_p$, are listed in a table 400, as estimation results of the track deterioration model, as shown in FIG. 4.

At step 308, the probability of a Class II geo defect becoming Class I at some future time is computed. To compute the probability of a Class II defect becoming Class I in the future, the defect amplitude for the next inspection run is predicted, and is shown with the actual amplitude in FIG. 4. For purposes of illustration let $\Delta t=90$ days. Assuming the threshold for of a Class II defect becoming a Class I for a certain defect type is r, define:

$$h_k(t) = \log\left(\frac{r - y_k(t)}{\Delta t y_k(t)}\right),$$

$$z = \log\left(\frac{y_k(t+\Delta t)-y_k(t)}{\Delta t y_k(t)}\right)$$

where z is normally distributed. The risk, $p_k(t)$, of a Class II geo defect at time t on track segment k becoming Class I in $\Delta t$ is:

$$p_k(t) = \int_{h_k(t)}^{\infty} z\, dz$$

The Track Derailment Risk Model

Survival analysis is used to describe the analysis of data regarding the occurrence of a particular event, within a time period after a well defined time origin. Analyzing survival times may be used in areas, such as biomedical computation, engineering, and the social sciences.

In the railway application described herein, each inspection run may "refresh" the track segment data since all Class I geo defects will be repaired. If there is no derailment between two scheduled inspection runs on a track segment, the track can be considered to have "survived" from one inspection to the next. If any derailment occurs, the track segment is said to have "failed" in the time period since the last inspection run.

Associated with the survival of a track section at a point in time, the derailment on this track section is referred to as a hazard. In survival theory, there are three basic functions: the density function f(t), survival function S(t), and hazard function $\lambda(t)$. For a derailment, the density function f(t) expresses the likelihood that the derailment will occur at time t. The survival function represents the probability that the track section will survive until time t:

$$S(t) = Prob(T \geq t)$$
$$= \int_t^\infty f(x)dx$$
$$= 1 - \int_0^t f(x)dx$$
$$= 1 - F(t)$$

where T denotes the variable of survival time of a track segment after inspection, and F(t) denotes the cumulative function of variable T. The hazard function is the likelihood that a derailment takes place in time t given that it has lasted at least until t. By definition, the relationship between these three functions may be expressed as:

$$\lambda(t) = \frac{f(t)}{S(t)} = -\frac{d\ln S(t)}{dt}$$
$$S(t) = \exp\left[-\int_0^t \lambda(x)dx\right]$$
$$f(t) = \lambda(t)S(t)$$
$$= \lambda(t)\exp\left[-\int_0^t \lambda(x)dx\right]$$

The hazard function represents the instantaneous rate of failure probability at time t, given the condition that the event survived to time t. Parametric models may be used to specify the density distribution f(t), such as exponential, Weibull, log logistic, and log normal distributions; however, such pre defined distributions may not appropriately fit real world data. Without having to specify any assumptions about the shape of the baseline function, a method for estimating the coefficients of covariates in the model using the method of partial likelihood (PL) rather than maximum likelihood is desired, such as a Cox model. The Cox model is sometimes referred to as a semi parametric model, and it assumes that the covariates multiplicatively shift the baseline hazard function. The Cox model, unlike the parametric approaches, does not need an assumption about the baseline hazard function. Furthermore, unlike non parametric analysis such as the Kaplan Meire method and the rank test, the Cox model allows both nominal and continuous variables.

The hazard function form of Cox model may be expressed as:

$$\lambda(t,\beta,X) = \lambda_0(t)e^{\beta'X}$$

where $\lambda_0(t)$ is an unspecified nonnegative function of time called the baseline hazard, and $\beta$ is a columnvector of coefficients to be estimated, and $\beta'X = \beta_0 + \beta_1 x_1 + \beta_2 x_2 + \ldots + \beta_k x_k$. Because the hazard ratio for two subjects with fixed covariate vectors $X_i$ and $X_j$, $$\frac{\lambda_i(t)}{\lambda_j(t)} = \frac{\lambda_0(t)e^{\beta'X_i}}{\lambda_0(t)e^{\beta'X_j}},$$

is constant over time, the model is also known as the proportional hazards (PH) model. In order to estimate $\beta$, Cox proposes a conditional (or partial) likelihood function which depends only on the parameter of interest. The partial likelihood function is described as:

$$L_p(\beta) = \prod_{i=1}^n \left[\frac{e^{\beta'X_i}}{\sum_{j \in R(t_{(i)})} e^{\beta'X_j}}\right]^{\delta_i}$$

The maximum partial likelihood estimator may be determined by solving t the following equation:

$$\frac{\partial \ln(L_p(\beta))}{\partial \beta} = 0$$

Figure 6:
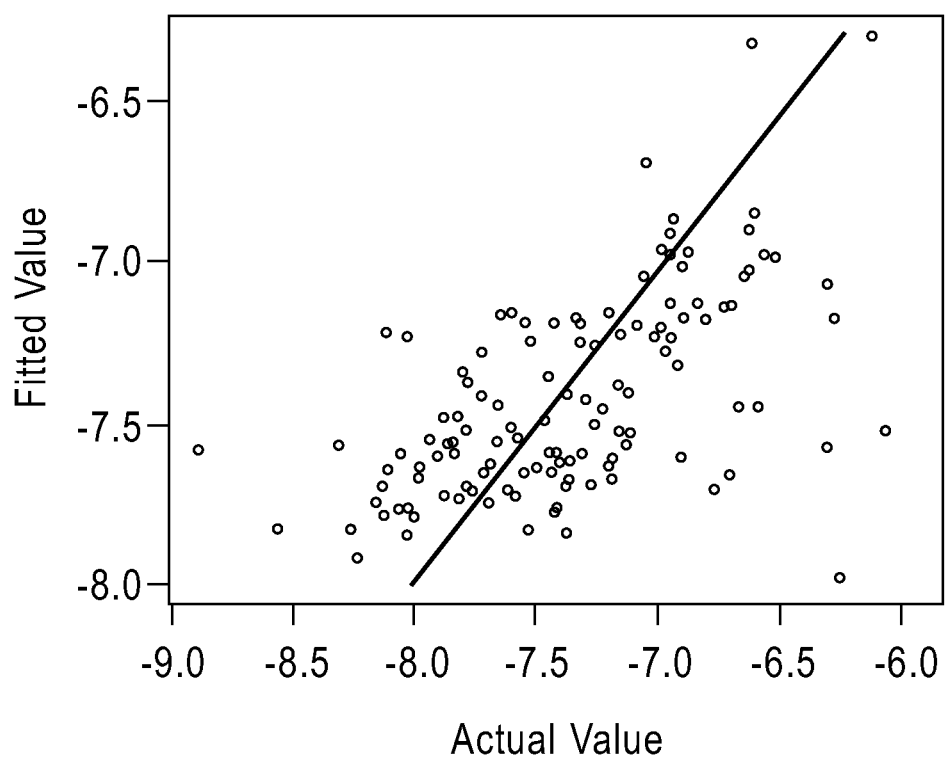
FIG. 6 is a graphical depiction of predicted versus actual geo defect amplitudes in accordance with an embodiment of the present invention.
Figures 7, 8:
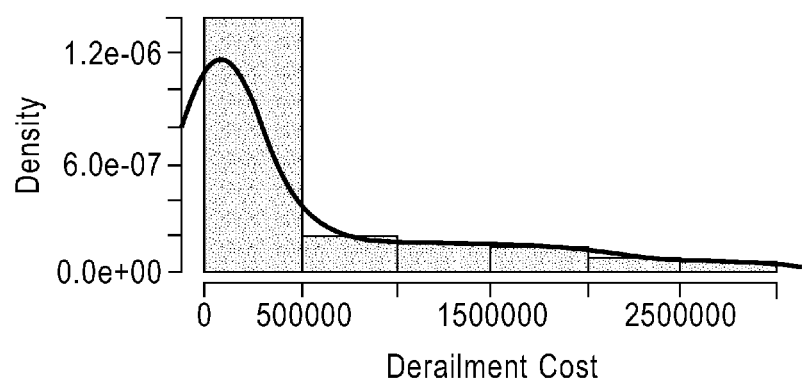
FIG. 7 depicts a table of estimation results of a Cox proportional hazards model in accordance with an embodiment of the invention.
FIG. 8 is a graphical depiction of sample probability density data for derailment costs in accordance with an embodiment of the present invention.

Fitting a Cox model may be implemented using existing statistical software. As described above, the raw geo defects are spatially aggregated to the section level (e.g., 2 miles), and temporally into each inspection level. In one aggregated record, e.g., as shown in FIG. 6, the dependent variable is either the time duration between two inspection runs (censored survival time), or time duration between the derailment and the last inspection run before derailment. Selected candidate predictors may include monthly traffic in MGT, number of Class II geo defects (starting with "numCII") in each defect category, and 90 percentile amplitude (starting with "amp90") of Class II geo defects in each defect category.

The final Cox model fit to the censoring derailment data is illustrated in FIG. 6. One efficient way to evaluate the fitted model is to use Cox Snell residuals. If the model is calibrated correctly, the Cox Snell residuals should show a standard exponential distribution with hazard function equal to one, and thus the cumulative hazard of the Cox Snell residuals should follow a straight 45 degree line.

The model shown in FIG. 6 includes ten covariates. Each significant covariate represents a particular geo defect type. To further explain the covariate, a positive coefficient means that the hazard is higher (hazard ratio is greater than 1.0), whereas a negative one indicates a lower hazard (hazard ratio is less than 1.0). In the fitted model, all the covariates have positive coefficients, indicating that all geo defect types listed in FIG. 6 have a strong positive impact on derailment risk. Those 10 significant geo defect types can be categorized into two groups: the number based and amplitude based groups. On one hand, the number based group consists of GAUGE_W1, REV_X and GAUGE_W2, in which the number of geo defect in a track section determines the derailment risk. On the other hand, the amplitude based group includes SUPER_X, GAUGE_C, DIP, WARP, HARM_X, WEAR, and ALIGN, and the 90 percentile of geo defect amplitudes plays an important role to influence track geometry induced derailment.

Therefore, the derailment probability, $P_i(t)$, on section i prior to time t can be derived at step 310 from:

$$P_i(t) = \text{Prob}_i(T \leq t) = 1 - S_i(t)$$

where $S_i(t)$ indicates the survival probability on section i prior to time t. Furthermore, the derailment probability after repair alternative a is taken, $P_i(t, a)$, can also be calculated in similar fashion:

$$P_i(t,a) = 1 - S_i(t,a)$$

where $S_i(t, a)$ is the survival probability after repair action a is performed on section i prior to time t.

Optimal Track Repair

As described above, two models have been provided: one to predict deterioration of Class II defects into Class I defects, and another to predict track based derailments of trains. The results of these two models may be used, along with information regarding costs, as inputs for an optimization model under uncertainty at step 312.

According to FRA regulations, all Class I defects have to be repaired as soon as possible; however, determining which Class II defects should be repaired by the railways company can be challenging. There are costs associated with repairing Class II defects, but doing so may decrease the probability of derailment, which in turn would decrease expected derailment costs. It may be particularly prudential to repair Class II geo defects that are likely to soon become Class I defects, since they will have to be repaired in the future anyway. The decision maker in such situations is usually the local track master, who may be in charge of several sections along a line segment. For instance, the track master may be responsible for track repair decisions for 50 miles of track, e.g., 25 sections of 2 miles each.

The track repair optimization processes will now be described. The track optimization processes of the geo defect repair modeling processes use a simple single stage model and describe the parameters and relevant assumptions, as indicated below:

Decision Variables

Due to the economies of scale involved, it is assumed that the decision maker either repairs none of the defects or all the defects of a particular category in that section. Suppose that a section is observed to contain Class II defects of 3 defect categories. In this case, there are $2^3=8$ alternatives available to the decision maker, because s/he can choose to repair none or all of the defects of each type in any possible combination. Decision variables are denoted using indicator variables $x^i_a$. If alternative $a \in A$ is chosen for section $i \in I$, then $x^i_a = 1$, otherwise $x^i_a = 0$. The decision maker can choose only one of the alternatives for a particular section, and this results in a feasibility constraint:

$$\sum_{a \in A} x^i_a = 1 \ \forall i \in I.$$

$$= C_D \sum_{i \in I, a \in A} x^i_a P^i_a, \text{ where } P^i_a$$

Cost and Probability Parameters

After an inspection run by the geometry car, the decision maker must fix all observed Class I defects. The cost of repairing such defects is denoted in section i as $C^i_1$. If the decision maker repairs all of the Class II defects of a certain category in a section, then it is clear that there will be costs associated with repairing these defects. The cost of Class II defect repair:

$$\sum_{i \in I, a \in A} x^i_a C^i_{2,a}, \text{ where } C^i_{2,a}$$

is the cost of repairing all Class II defects for section i if alternative a is chosen.

If Class II defects are not repaired, then there will be costs associated with repairing them at the next inspection run if they turn into Class I defects. Hence similarly, the expected cost of Class I defect repair is:

$$\sum_{i \in I, a \in A} x^i_a C^i_{1,a}$$

$C^i_{1,a}$ is the expected cost of Class I defect repair for section i if alternative a is chosen, and it includes the probability of deterioration of all Class II defects into Class I defects. Specifically, $$C^i_{1,a} = \sum_{j \in J} \sum_{k \in K} p^k_a C^j_{1,a}$$

where the summation is over all defect categories j in section i, and for all defects k in category j. $p^k_a$ is the probability that this defect will progress to a Class I defect if alternative a is chosen ($p^k_a=0$ when defect k is repaired, otherwise $p^k_a = p_k(t)$), and $C^j_{1,a}$ is the cost of fixing a Class I defect of category j when alternative a is chosen. Likewise, there are also costs associated with derailment:

Expected cost of $$\text{Expected cost of derailment} = C_D \sum_{i \in I, a \in A} x^i_a P^i_a,$$

where $P^i_a$ is the probability of derailment in section i if alternative a is chosen, and $C_D$ is the expected derailment cost. A derailment may be defined as the interruption of normal wheel to rail interaction, and the consequences of derailments can vary significantly, from slight equipment damage to passenger injury or even death. FIG. 6 presents the derailment cost data and a fitted probability density function. The derailment cost distribution follows a heavy tailed distribution, ranging from hundreds of US dollars to millions of US dollars.

The formal optimization model may be expressed as follows:

$$\text{Minimize total expected cost} = \sum_{i \in I} \sum_{a \in A} x^i_a (C^i_{2,a} + C^i_{1,a} + C_D P^i_a) + C^i_1 \quad (1a)$$

$$\text{Subject to } x^i_a = \{0, 1\} \ \forall i \in I, \forall a \in A \quad (1b)$$

$$\sum_{a \in A} x^i_a = 1 \ \forall i \in I \quad (1c)$$

$$\sum_{i \in I, a \in A} x_a^i C_{2,a}^i \le B \quad (1d)$$

Objective (1a) seeks to minimize the total expected cost, which is the sum of Class I and II defect repair costs in this period, expected Class I defect repair costs in the next period, and expected derailment costs in the intermediate time period.

Equation (1b) specifies that the decision variables are binary 0 1 variables.

Equation (1c) is for feasibility, indicating that only 1 alternative can be chosen for any particular section.

Inequality equation (1d) is a capacity constraint where the total repair cost of Class II defects cannot exceed the available budget. If the budget includes both Class I and Class II defects for the current inspection run, then this constraint can be modified to:

$$\left(\sum_{i \in I, a \in A} x_a^i C_{2,a}^i\right) + C_1^i \le B.$$

The optimization model is a binary integer programming (BIP) problem which is linear in the objective function as well as constraints, and it can be solved using standard commercial solvers.

Note that when the cost of derailment is a random variable, due to the nature of the optimization formulation, one may simply replace derailment cost $C_D$ with the expected derailment cost $\overline{C_D}$ in the optimization model 1(a)(d). This is because the total expected cost is given as:

$$E\left[\sum_{i \in I} \sum_{a \in A} x_a^i (C_{2,a}^i + C_{1,a}^i + C_D P_a^i) + C_1^i\right] = \quad (2)$$

$$\sum_{i \in I} \sum_{a \in A} E[x_a^i (C_{2,a}^i + C_{1,a}^i + C_D P_a^i) + C_1^i] =$$

$$\sum_{i \in I} \sum_{a \in A} x_a^i (C_{2,a}^i + C_{1,a}^i + E[C_D] P_a^i) + C_1^i =$$

$$\sum_{i \in I} \sum_{a \in A} x_a^i (C_{2,a}^i + C_{1,a}^i + \overline{C_D} P_a^i) + C_1^i$$

since the expectation of a sum is the sum of expectations. According to expression (2), the stochastic objective will eventually be derived the same as deterministic one (1a). Therefore, the proposed BIP can also handle uncertainty derailment costs.

Comparison with Heuristic Strategies

The solution of the optimization formulation may be compared with two "baseline" heuristic strategies that are intuitive and commonly used in practice to make track repair decisions.

Heuristic I: Distance Based Strategy (HEUI)

It is intuitive and cost efficient to repair a Class II defect that is near a Class I defect of the same category. In the distance based strategy, Class II defects close to Class I defects in the same category are likely to be repaired. The expression:

$$D_j^i = \min(d_j^{ik}) \; \forall i,j$$

is defined as the distance index of section i and defect category j, and $d_j^{ik}$ represents the distance to the nearest Class I defect for Class II defect k in section i and category j. Given a budget, section and defect category, the section and category pairs (i,j) are ranked and selected for repair in ascending order of the distance index, until the budget is consumed.

Heuristic II: Severity Based Strategy (HEUII)

In the severity based strategy, an empirical aggregate level measure of defect amplitudes is computed for every section and category. The severity index may be defined as:

$$S_j^i = \exp\left(\frac{\max(\omega_j^{ik})}{\omega_j^{max}}\right) \ln(n_j^i) \; \forall i, j$$

where $\omega_j^{ik}$ is the amplitude of Class II defect k in section I and category j, $\omega_j^{max}$ denotes the maximum amplitude of geo defect category j, $n_j^i$ and represents the number of Class II defects in section I and category j. These severity measures are ranked and each section and category pair (i,j) is repaired in descending order of severity, until the budget is consumed.

As described above, the geo defect repair modeling processes provides an analytical framework to address the track geo defect repair problem using three models. First, a deterioration model is specially designed for track Class II geo defects, and it is configured to model deterioration rates for each geo defect category. Second, a track derailment risk model is proposed by applying survival analysis. This model incorporates combinations of effects from different types of geo defects, and represents how derailment risk changes over time. Finally, an optimization model is formulated for making geo defect repair decisions. The methodology can yield more reliable and less costly solutions than typical heuristic strategies used according to current industry practices.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non exhaustive list) of the computer readable storage medium would include the following: an electrical connection having one or more wires, a portable computer diskette, a hard disk, a random access memory (RAM), a read only memory (ROM), an erasable programmable read only memory (EPROM or Flash memory), an optical fiber, a portable compact disc read only memory (CD ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method, comprising:
   logically dividing a railroad network according to spatial and temporal dimensions with respect to historical data collected for the railroad network, the spatial dimensions including line segments of a specified length and the temporal dimensions including inspection run data for inspections performed for each of the line segments over a specified period of time;
   creating, via a computer processor, a track deterioration model from the historical data, current track conditions collected from one or more data sources, and traffic data;
   identifying geo-defects occurring at each inspection run from the track deterioration model;
   analyzing quantified changes in the geo-defects measured at each inspection run;
   predicting from the quantified changes in the geo-defects, where at least one of the geo-defects is a Class II geo-defect, with an amplitude below a tolerance level of a safety standard, a probability of the least one Class II geo-defect deteriorating into a Class I defect with an amplitude in violation of the safety standard, within a specified period of time, the Class I defect defined as one that is mandated to be repaired upon discovery;
   upon determining the probability reaches a threshold value, scheduling a repair to remedy the at least one Class II geo-defect within the specified period of time;
   upon determining the probability does not reach a threshold value, determining a repair decision based on historically determined costs associated with previous comparable repairs; and
   initiating the repair decision; wherein
   determining the repair decision comprises minimizing a minimum total expected cost based on the historically determined costs.

2. The method of claim 1, wherein the line segments are defined as connecting two cities, and the spatial dimensions further include at least one of track identifiers and mile post locations.

3. The method of claim 1, wherein the railroad network is further divided into non-overlapping lots each of a length shorter than a length of the line segments, the method further comprising:
   aggregating the geo-defects by inspection run for each geo-defect type.

4. The method of claim 3, wherein geo-defect types include at least one of:
   align;
   cant;
   dip;
   gauge;
   harmonic cross-level;
   over-elevation;
   reverse cross-level;
   super cross-level elevation;
   surf;
   twist;
   warp; and
   wear.

5. The method of claim 1, wherein the analyzing the quantified changes in the geo-defects includes analyzing amplitude changes for each of the geo-defects at each inspection run, and wherein a 90 percentile of an amplitude is designated to represent a track condition for a corresponding inspection run.

6. The method of claim 1, wherein the railroad network is further divided into sections of two miles in length, and the calculating a derailment risk includes:
   spatially aggregating the geo-defects at a section level;
   temporally aggregating the geo-defects into each inspection level; and
   creating a record from results of the spatially aggregating and the temporally aggregating.

7. The method of claim 1, wherein the determining a repair decision includes, for each of the geo-defects rated as Class II geo-defects:
   determining which of the Class II geo-defects are likely to result in a derailment before the defined future point in time; and
   determining costs previously associated with repairing the Class II geo-defects.

8. The method of claim 7, further comprising: calculating an expected cost of derailment.

9. The method of claim 1, further comprising: calculating a derailment risk by:
   spatially aggregating the geo-defects at a section level;
   temporally aggregating the geo-defects into each inspection level; and
   creating a record from results of the spatially aggregating and the temporally aggregating; wherein the railroad network is further divided into sections of two miles in length.

10. The method of claim 9, wherein the calculating the derailment risk further includes:
    calculating a hazard function representing an instantaneous rate of failure probability given a survival by using a method of partial likelihood.

11. The method of claim 10, wherein calculating the hazard function comprises fitting a Cox model.

12. A computer program product comprising a computer-readable storage medium having program code embodied thereon, wherein the computer readable storage medium is not a transitory signal per se, which when executed by a computer processor, causes the computer processor to implement a method, the method comprising:
    logically dividing a railroad network according to spatial and temporal dimensions with respect to historical data collected for the railroad network, the spatial dimensions including line segments of a specified length and the temporal dimensions including inspection run data for inspections performed for each of the line segments over a specified period of time;
    creating, via a computer processor, a track deterioration model from the historical data, current track conditions collected from one or more data sources, and traffic data;
    identifying geo-defects occurring at each inspection run from the track deterioration model;
    analyzing quantified changes in the geo-defects measured at each inspection run;
    predicting from the quantified changes in the geo-defects, where at least one of the geo-defects is a Class II geo-defect, with an amplitude below a tolerance level of a safety standard, a probability of the least one Class II geo-defect deteriorating into a Class I defect with an amplitude in violation of the safety standard, within a specified period of time, the Class I defect defined as one that is mandated to be repaired upon discovery;

upon determining the probability reaches a threshold value, scheduling a repair to remedy the at least one Class II geo-defect within the specified period of time;

upon determining the probability does not reach a threshold value, determining a repair decision based on historically determined costs associated with previous comparable repairs; and initiating the repair decision; wherein determining the repair decision comprises minimizing a minimum total expected cost based on the historically determined costs.

13. The computer program product of claim 12, wherein the line segments are defined as connecting two cities, and the spatial dimensions further include at least one of track identifiers and mile post locations.

14. The computer program product of claim 12, wherein the railroad network is further divided into non-overlapping lots each of a length shorter than a length of the line segments, the method further comprising:

aggregating the geo-defects by inspection run for each geo-defect type.

15. The computer program product of claim 14, wherein geo-defect types include at least one of:

align;
cant;
dip;
gauge;
harmonic cross-level;
over-elevation;
reverse cross-level;
super cross-level elevation;
surf;
twist;
warp; and
wear.

16. The computer program product of claim 12, wherein the analyzing the quantified changes in the geo-defects includes analyzing amplitude changes for each of the geo-defects at each inspection run, and wherein a 90 percentile of an amplitude is designated to represent a track condition for a corresponding inspection run.

17. The computer program product of claim 12, wherein the railroad network is further divided into sections of two miles in length, and the calculating the derailment risk includes:

spatially aggregating the geo-defects at a section level;

temporally aggregating the geo-defects into each inspection level; and creating a record from results of the spatially aggregating and the temporally aggregating.

18. The computer program product of claim 12, wherein the determining a repair decision includes, for each of the geo-defects rated as Class II geo-defects:

determining which of the Class II geo-defects are likely to result in a derailment before the defined future point in time; and determining costs previously associated with repairing the Class II geo-defects.

* * * * *